United States Patent
Li et al.

(10) Patent No.: US 11,955,968 B2
(45) Date of Patent: Apr. 9, 2024

(54) COMBINED LOGIC CONTROL CIRCUIT AND SEWAGE TREATMENT SYSTEM

(71) Applicant: YUNNAN HEXU ENVIRONMENTAL TECHNOLOGY CO., LTD., Yunnan Province (CN)

(72) Inventors: Wensheng Li, Yunnan Province (CN); Jingguo Ding, Yunnan Province (CN); Jiesheng Luo, Yunnan Province (CN); Ranrong Liu, Yunnan Province (CN)

(73) Assignee: YUNNAN HEXU ENVIRONMENTAL TECHNOLOGY CO., LTD., Unnan Province (CN)

( * ) Notice: Subject to any disclaimer, the term of this patent is extended or adjusted under 35 U.S.C. 154(b) by 241 days.

(21) Appl. No.: 17/668,168

(22) Filed: Feb. 9, 2022

(65) Prior Publication Data

US 2022/0271751 A1 Aug. 25, 2022

Related U.S. Application Data

(63) Continuation-in-part of application No. PCT/CN2019/116358, filed on Nov. 7, 2019.

(51) Int. Cl.
*H03K 19/003* (2006.01)
*C02F 1/00* (2023.01)
(Continued)

(52) U.S. Cl.
CPC .......... *H03K 19/003* (2013.01); *C02F 1/008* (2013.01); *C02F 2101/105* (2013.01); *C02F 2201/005* (2013.01); *C02F 2209/006* (2013.01); *C02F 2209/008* (2013.01); *C02F 2209/02* (2013.01); *C02F 2209/03* (2013.01); *C02F 2209/40* (2013.01); *C02F 2209/42* (2013.01); *C02F 2303/04* (2013.01); *H04L 12/40* (2013.01)

(58) Field of Classification Search
None
See application file for complete search history.

(56) References Cited

U.S. PATENT DOCUMENTS

| 6,609,070 B1 * | 8/2003 | Lueck ..................... G01N 33/18 |
| | | 702/50 |
| 2007/0170112 A1 | 7/2007 | Elefritz et al. |

(Continued)

FOREIGN PATENT DOCUMENTS

| CN | 201413570 Y | 2/2010 |
| CN | 102261929 A | 11/2011 |

(Continued)

OTHER PUBLICATIONS

International Search Report for International Application No. PCT/CN2019/116358; Date of Completion: Jul. 3, 2020; dated Aug. 11, 2020; 4 Pages.

(Continued)

*Primary Examiner* — Jany Richardson
(74) *Attorney, Agent, or Firm* — CANTOR COLBURN LLP (57) ABSTRACT

A combined logic control circuit and a sewage treatment system are provided. The combined logic control circuit includes: at least one signal input component, a control component and at least one signal output component; each signal input component transmits at least one path of first communication signal in a photoelectric isolated manner and converts the first communication signal into a second communication signal; the control component generates at least one path of first control signal according to the at least one path of second communication signal; and each signal output component processes one path of the first control signal to control at least one external electrical device, thereby implementing a particular circuit function; and the power switch component provides power supply to the various circuit components in a photoelectric isolated manner.

20 Claims, 5 Drawing Sheets

(51) Int. Cl.
*C02F 101/10* (2006.01)
*H04L 12/40* (2006.01)

(56) References Cited

U.S. PATENT DOCUMENTS

| | | | |
|---|---|---|---|
| 2008/0308493 A1 | 12/2008 | Amir et al. | |
| 2009/0206023 A1* | 8/2009 | Rohde | A61M 1/1601 210/321.71 |
| 2015/0180275 A1* | 6/2015 | Tomassi | H02J 9/061 307/64 |

FOREIGN PATENT DOCUMENTS

| | | |
|---|---|---|
| CN | 103058359 A | 4/2013 |
| CN | 207490955 U | 6/2018 |
| CN | 207650620 U | 7/2018 |
| CN | 207780567 U | 8/2018 |
| KR | 100911688 B1 | 8/2009 |

OTHER PUBLICATIONS

Translation of International Search Report for International Application No. PCT/CN2019/116358; Date of Completion: Jul. 3, 2020; dated Aug. 11, 2020; 3 Pages.

Written Opinion for International Application No. PCT/CN2019/116358; dated Aug. 11, 2020; 3 Pages.

\* cited by examiner

COMBINED LOGIC CONTROL CIRCUIT AND SEWAGE TREATMENT SYSTEM

CROSS-REFERENCE TO RELATED APPLICATION

This application is a continuation-in-part of PCT patent application Serial No. PCT/CN2019/116358, with an international filing date of Nov. 7, 2019, the contents of which are incorporated herein by reference in entirety.

TECHNICAL FIELD

The present disclosure relates to the technical field of electronic circuit, and particularly relates to a combined logic control circuit and a sewage treatment system.

BACKGROUND

With the rapid development of electronic technology, various systems for centralized control of circuits are gradually applied to various technical fields. In the process of centralized control of electronic components, a control device in the system have extremely important influence on functions of circuits of the electronic components, states of the circuits of the electronic components can be changed in real time through a control device, thus, the systems for centralized control of circuits can meet actual requirements of users on functions of circuits; a PLC (Programmable Logic Controller) system and a PAC (Programmable Automation Controller) system are taken as an example, various circuit control functions of the electronic components can be realized through the PLC.

However, in the related art, when the PLC or the PAC is used as a centralized control center, since some circuit control functions need to be added or reduced in some aspects according to an actual need of a technician in the technical field of different industries, however, at this time, the internal integrated control mode of the PLC or the PAC has been determined; the centralized control process of the PLC is prone to be subjected to communication interference and electric energy transmission interference from the external interference source in the process of information transmission between the control center of the PLC and the external electrical device in the related art, so that the qualities of centralized control and the anti-interference performances of the electronic components are reduced.

SUMMARY

The embodiments of the present application provide a method for discriminating vertical distribution models of organic carbons in ocean water area, a device for discriminating vertical distribution models of organic carbons in ocean water area, a terminal device and a storage medium, which can solve a problem that the accuracy of discrimination of distributions of organic carbons in ocean water area is low in the prior art.

One objective of the embodiments of the present disclosure is to provide a combined logic control circuit and a sewage treatment system, which aims to solve a problem that the centralized control mode in the related art is poor in reliability and compatibility, and is insufficient in expandability, and is prone to be subjected to communication interference and electric energy interference when being applied to different industrial environments, and a bad quality of control of the electronic components is caused.

In order to solve the technical problem mentioned above, the technical solutions involved in the embodiments of the present disclosure are as follows:

In the first aspect, a combined logic control circuit is provided, the combined logic control circuit includes:

a plurality of signal input components, where each of the signal input components is configured to receive at least one path of first communication signal, transmit one path of the first communication signal in a photoelectric isolated manner, and process the at least one path of first communication signal to obtain at least one path of second communication signal;

a control component which is connected with the plurality of signal input components and is configured to receive at least one path of second communication signal, and generate at least one path of first control signal according to the at least one path of second communication signal;

a plurality of signal output components, where each of the signal output components is commonly connected with the control component and a plurality of external electrical devices, and is configured to process the at least one path of the first control signal to obtain at least one path of second control signal, and control the corresponding external electrical device to perform a circuit operation according to the at least one path of the second control signal; and a power switch component which is commonly connected with the plurality of signal input components, the control component and the plurality of signal output components, and is configured to be connected with a power device to receive a power signal output by the power device, convert the power signal in an isolated manner and output the power signal converted in the isolated manner.

In the second aspect, a sewage treatment system is provided, the sewage treatment system includes:

the aforesaid combined logic control circuit, an air pump, a feeding pump, an electromagnetic valve, a fan, a lifting pump, a frequency converter, a mechanical grille, a stirrer, a sterilizer, an electrolyzation dephosphorization device, a water quality sensor, an ultrasonic liquid level indicator, a liquid flowmeter, a human-machine interaction interface, a temperature sensor, a humidity sensor, an atmosphere pressure sensor, and a liquid level floating ball switch; where the air pump, the feeding pump, the electromagnetic valve, the fan, the lifting pump, the frequency converter, the mechanical grille, the stirrer, the sterilizer, the electrolyzation dephosphorization device, the water quality sensor, the ultrasonic liquid level indicator, the liquid flowmeter, the human-machine interaction interface, the temperature sensor, the humidity sensor, the atmosphere pressure sensor, and the liquid level floating ball switch are commonly connected with the combined logic control circuit.

The combined logic control circuit according to the embodiments of the present disclosure has the beneficial effects that the combined logic control circuit can perform centralized conversion on the multiplex first communication signals respectively to realize different circuit functions, there is high expandability and compatibility in the centralized control process of the combined logic control circuit, particular circuit functions in various different industrial technical fields can be realized, the combined logic control circuit has a high reliability; moreover, the power switch component is used to supply power to the various circuit components in a photoelectric isolated manner, and the signal input component is used to perform isolated transmission, both the isolation of signal transmission and the isolation of power supplying in the combined logic control circuit are realized, the anti-interference performances and the reliability of the various circuit components are improved; the control component can be always kept in safe and stable integrated control state in the circuit system, the combined logic control circuit can be suitable for various different industrial environments, a multi-functional electrical control effect for the plurality of external electrical devices is realized, and various requirements of the technician on circuit control can be met.

BRIEF DESCRIPTION OF THE DRAWINGS

In order to describe the embodiments of the present disclosure more clearly, a brief introduction regarding the accompanying drawings that need to be used for describing the embodiments of the present disclosure or demonstrated technology is given below; it is apparent that the accompanying drawings described below are only some embodiments of the present disclosure, the person of ordinary skill in the art may also obtain other drawings according to these drawings without paying creative labor.

EMBODIMENTS OF THE PRESENT APPLICATION

In order to make the purpose, the technical solution and the advantages of the present disclosure be clearer and more understandable, the present disclosure will be further described in detail below with reference to the accompanying figures and the embodiments. It should be understood that the embodiments described in detail herein are merely intended to illustrate but not to limit the present disclosure.

Terms of "the first" and "the second" are only for the purpose of describing conveniently and should not be interpreted as indicating or implying relative importance or implicitly indicating the number of indicated technical features.

In order to describe the technical solutions of the present disclosure, the technical solutions are described in detail below with reference to the accompanying figures and embodiments.

Figure 1:
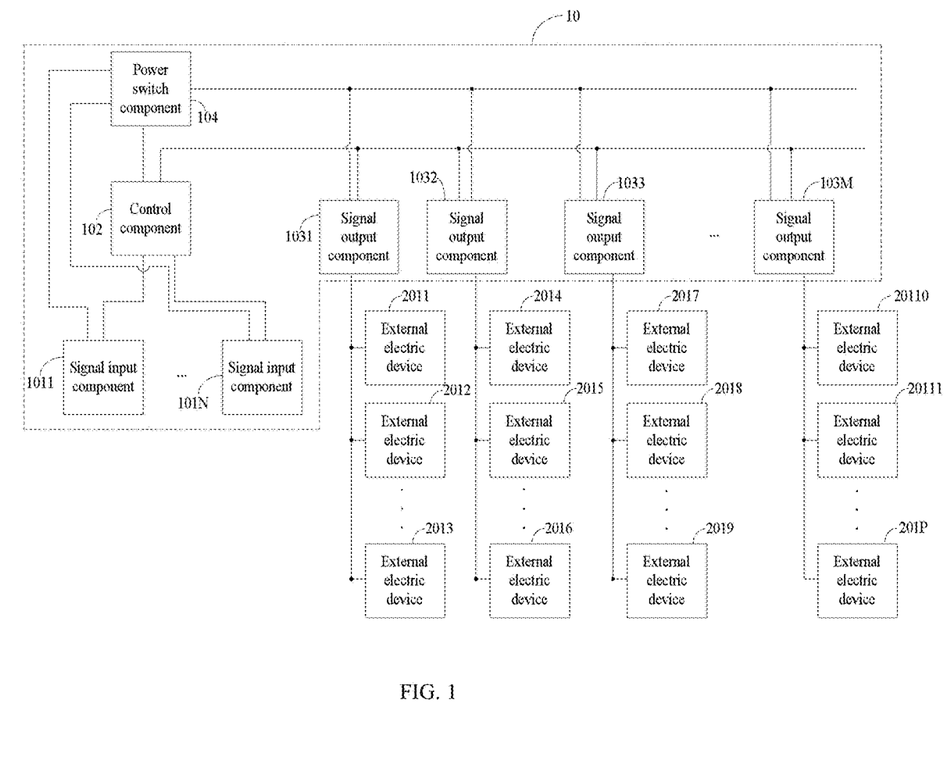
FIG. 1 illustrates a schematic block diagram of a combined logic control circuit according to one embodiment of the present disclosure.

FIG. 1 illustrates a schematic block diagram of a combined logic control circuit 10 according to one embodiment of the present disclosure. The combined logic control circuit 10 is capable of realizing safe and flexible control functions, and multi-function circuit control can be performed on the external electrical devices. As shown in FIG. 1, the combined logic control circuit 10 includes a plurality of signal input components (represented by 1011, . . . , 101N in FIG. 1, where N is an integer greater than 0), a control component 102, and a plurality of signal output components (represented by 1031, . . . , 103M in FIG. 1, where M is an integer greater than 0) and a power switch component 104.

Where, each of the signal input components is configured to receive at least one path of first communication signal, transmit the first communication signal in isolated manner, and process the first communication signal transmitted in the isolated manner to obtain one path of second communication signal.

For example, the isolated transmission that the signal input component performs on the first communication signal includes: photoelectric isolated, electromagnetic isolation, transformer isolation, relay isolation, etc., optically coupled isolation transmission is performed on the first communication signal through the signal input component, so that a physical damage caused by the first communication signal to electronic components inside the combined control circuit is avoided.

In one embodiment, the first communication signal is a digital quantity or an analog quantity, such that the signal input component can recognize different types of communication data, and has a higher expandability.

The control component 102 is connected with at least one signal input component and is configured to receive at least one path of second communication signal, and generate at least one path of first control signal according to the at least one path of second communication signal.

Where the control component 102 can implement centralized processing and conversion of data, for example, conversion manners such as filtering, signal format conversion, and pulse counting are performed on the second communication signal to obtain the first control signal through the control component 102, the first control signal includes complete and accurate circuit control information, and high efficient and centralized control of the external electrical devices is realized.

Each of the signal output components is connected with the control component 102, and connected with a plurality of external electrical devices (represented by 2011, . . . , 201P in FIG. 1, where P is an integer greater than 0), and each of the signal output components is configured to process one path of first control signal to obtain at least one path of second control signal, and control the corresponding external electrical device to perform circuit operation according to the second control signal.

In one embodiment, the external electrical devices are various types of electronically integrated components, such as a switch, a motor, a signal generator, and the like; where each of the signal output component has data distributed calculation and signal conversion function, receives and identifies one path of first control signal through the signal output component and obtain circuit control information in the first control signal, each of the signal output components outputs any number of second control signal after processing the first control signal, thereby realizing flexible circuit control of the external electrical devices, and any number of external electrical devices perform particular circuit operations according to the actual requirement of the user on circuit function, such that the combined logic control circuit can be compatible with and applicable to various different industrial technical fields, thereby realizes corresponding functions of circuits.

For example, the second control signal is analog quantity or digital quantity, such that analog regulation or digital control can be performed on the external electrical devices through the second control signal, a diversified requirement of circuit control of the combined logic control circuit 10 is realized.

Therefore, the number of the signal input components and the number of the signal output components in this embodiment can be arbitrarily adjusted, after signal processing and conversion are performed on any number of the first communication signal, adaptive circuit control is performed on any number of the external electrical devices, so that the combined logic control circuit has higher flexibility and compatibility; the signal input components, the signal output components and the control component in this embodiment are independent from each other, and signal processing and conversion can be performed; moreover, the control component 102 is not directly electrically connected with the external electrical devices, and the control component 102 is always in the safest circuit position in the combined logic control circuit 10.

The power switch component 104 is connected with the at least one signal input component, the control component 102, and the at least one signal output component, and is configured to receive a power signal output by a power device and convert the power signal in an isolated manner when being connected with the power device.

Where the power device stores electric energy, for example, the electric energy device is a DC (Direct Current) power supply or an AC (Alternating Current) power supply, and the power switch component 104 is used to perform isolated transmission on the power signal to output high-voltage or low-voltage electric energy, thereby supplying power to the signal input components, the control component 102, and the signal output components in the combined logic control circuit 10, the combined logic control circuit 10 is higher in safety of power supplying; for example, after the power switch component 104 performs isolated voltage drop or isolated voltage boost on the power signal, all circuit components can be powered up according to a rated power, and the power switch component 104 has more flexible power conversion performance; the internal circuit components of the combined logic control circuit 10 realize dual isolation of signals and electric energy, so that the combined logic control circuit 10 can control the external electrical equipment in various different industrial environments efficiently and flexibly, and has a higher practical value.

Figure 2:
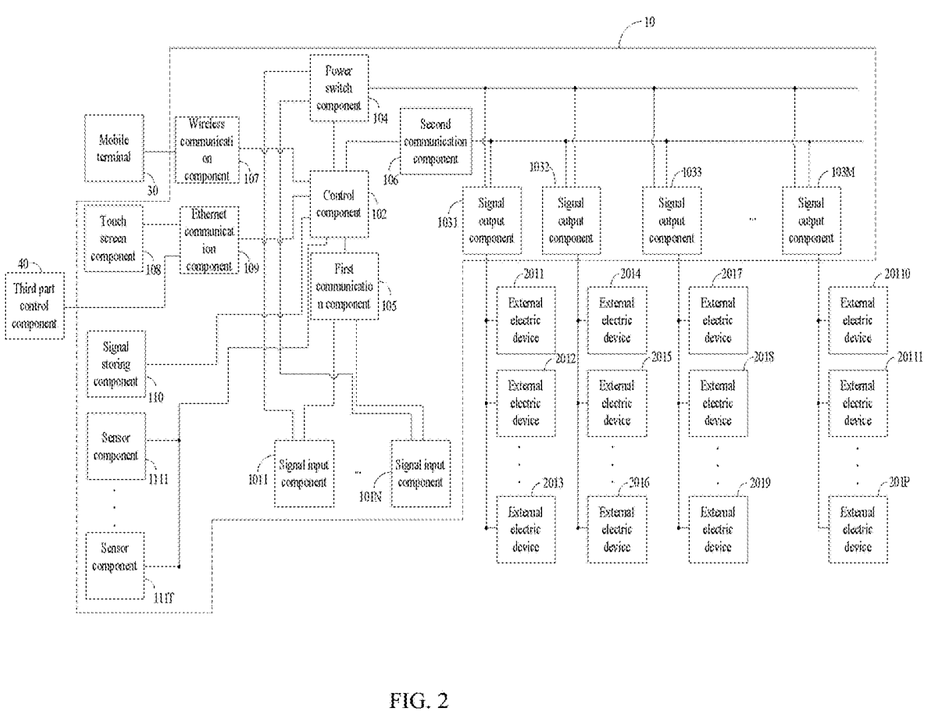
FIG. 2 illustrates a schematic block diagram of a combined logic control circuit according to another embodiment of the present disclosure.

As an alternative embodiment, FIG. 2 illustrates another schematic block diagram of the combined logic control circuit 10 according to this embodiment, as compared to the schematic structure of the combined logic control circuit 10 in FIG. 1, the combined logic control circuit 10 in FIG. 2 further includes: a first communication component 105 and a second communication component 106; the first communication component 105 is connected with each of the signal input components and the control component 102, and is configured to output the second communication signal to the control component 102.

The second communication component 106 is connected with the control component 102 and each of the signal output components and is configured to output the first control signal to the signal output components.

In one embodiment, the first communication component 105 includes at least one from a group consisting of a CAN (Controller Area Network) bus, an RS485, an RS232, and an Ethernet.

In one embodiment, the second communication component 106 includes at least one from a group consisting of a CAN bus, an RS485, an RS 232, and an Ethernet.

As an alternative embodiment, referring to FIG. 2, the combined logic control circuit 10 further includes: a wireless communication component 107, where the wireless communication component 10 is connected with the control component 102 and the mobile terminal 30, and configured to transmit the wireless communication signal output by the mobile terminal 30 to the control component 102 wirelessly.

The control component 102 is configured to receive at least one path of second communication signal, and convert the at least one path of second communication signal according to the wireless communication signal, thereby generates at least one path of first control signal.

In one embodiment, the wireless communication component 107 includes at least one from a group consisting of 2G (The 2nd generation mobile communication technology), 3G (The 3rd generation mobile communication technology), 4G (The Fourth generation mobile communication technology), 5G (The Fifth generation mobile communication technology), NB-IoT (Narrow Band Internet of Things), LoRa (Long range Radio), Zigbee, Wi-Fi (Wireless Fidelity), and Bluetooth.

For example, the mobile terminal 30 is a mobile phone or a tablet computer.

It needs to be noted that, the NB-IoT and the LoRa belong to different communication modes of Internet of Things, respectively, where the LoRa performs data interaction transmission according to a LPWAN protocol standard; the NB-IoT can meet different communication standards and support different signal transmission bandwidths; therefore, efficient bidirectional data transmission can be maintained in different data transmission environments through NB-IoT and LoRa.

Therefore, in this embodiment, a wireless signal communication function between the control component 102 and the mobile terminal 30 can be implemented through the wireless communication component 107, so that the combined logic control circuit 10 performs data interaction operation based on 2G, 3G, 4G, and 5G; in one aspect, a signal conversion step of the control component 102 may be changed by the wireless communication signal output by the mobile terminal 30, and the combined control component 10 performs flexible electrical control on the plurality of external electrical devices, so that there is a higher controllability in the signal conversion process of the control component 102; in another aspect, the wireless communication component 107 can upload signal conversion information of the control component 102 to the mobile terminal 30 wirelessly, so that the user is facilitated to obtain the actual circuit control state of the combined logic control circuit 10 in real time through the mobile terminal 30, a good user experience is brought to the user.

As an alternative embodiment, referring to FIG. 2, the combined logic control circuit 10 further includes a touch screen component 108 and an Ethernet communication component 109; where the touch screen component 108 is configured to receive key information from the user and output a touch screen control signal; where the key signal from the user includes a circuit control requirement, the touch screen component 108 can generate a touch screen control signal according to the circuit control requirement from the user, and the touch screen control signal includes complete circuit control information for changing the circuit control function of the combined logic control circuit 10 in real time.

The Ethernet communication component 109 is connected between the touch screen component 108 and the control component 102, and is configured to output the touch screen control signal to the control component 102 through an Ethernet communication mode.

In one embodiment, the Ethernet communication component 109 includes an RJ45 interface, the Ethernet communication function is implemented for the signal through the RJ45 interface, and high efficient and compatible communication is performed between the control component 102 and the touch screen component 108, and there is a better compatibility.

The control component 102 is configured to receive at least one path of second communication signal, and convert the at least one path of second communication signal according to the touch screen control signal to generate at least one path of first control signal.

In this embodiment, the touch screen component 108 can receive the key information of the user in real time, after wireless signal interaction with the Ethernet communication component 109, the signal conversion state of the control component 102 can be changed in real time through the touch screen control signal, there is an excellent controllability in the signal conversion process of the combined logic control circuit 10.

As an alternative embodiment, the Ethernet communication component 109 is further configured to be compatible with a third-party control component 40, where the third-party control component 40 stores huge control data, then, the third-party control component 109 transmits the control data to the control component 102 wirelessly through the Ethernet communication component 109 so as to change the signal conversion state of the control component 102 in real time, there is higher controllability and flexibility in the signal conversion state of the control component 102, the combined logic control circuit 10 can be compatible with the access of the third-party control component, and compatibility of the circuit control and stability of data interaction of the control component 102 are improved.

For example, the third-party control component 40 is a PLC, etc., so that the combined logic control circuit 10 can be compatible with various different industrial places, thereby implements corresponding circuit functions.

As an alternative embodiment, referring to FIG. 2, the combined logic control circuit 10 further includes a signal storage component 110 connected with the control component 102 and configured to store at least one path of second communication signal.

Where the signal storage component 110 has a signal storage function, when the control component 102 performs signal conversion, the signal storage component 110 can store communication data transmitted by the control component 102, so that the signal storage component 110 can store the second communication signal safely, data loss phenomenon occurring in the circuit control process of the combined logic control circuit 10 is avoided, and the safety of centralized control of circuits and the stability of signal conversion of the control component 102 are ensured.

As an alternative embodiment, referring to FIG. 2, the combined logic control circuit 10 further includes at least one sensor component (represented by 1111, . . . , 111T in FIG. 2, where T is an integer greater than 0), each sensor component is connected with the control component 102 and the at least one external electrical device, and is configured to collect an operating parameter of the external electrical device connected with the sensor component and an environmental parameter in a preset region, and output one path of first modulated signal.

The control component 102 is configured to receive at least one path of second communication signal, and convert the at least one path of second communication signal according to the at least one first modulated signal so as to generate at least one path of first control signal.

For example, the sensor component is a fluid flowmeter sensor, a temperature sensor, an atmosphere sensor or a conductivity sensor, or the like, operation parameters of any number of external electric devices can be acquired through the sensor component, so that the condition of change of operation state of each external electric device can be detected by sensing, the control component 102 generates at least one path of first control signal according to the actual operation state of each of the external electrical devices, and performs feedback control on the external electrical devices according to the first control signal, so that the stability in operation and the safety of circuit control of the external electrical devices are ensured, and the requirement of the user on comprehensive and multi-functional circuit control are met.

Figure 3:
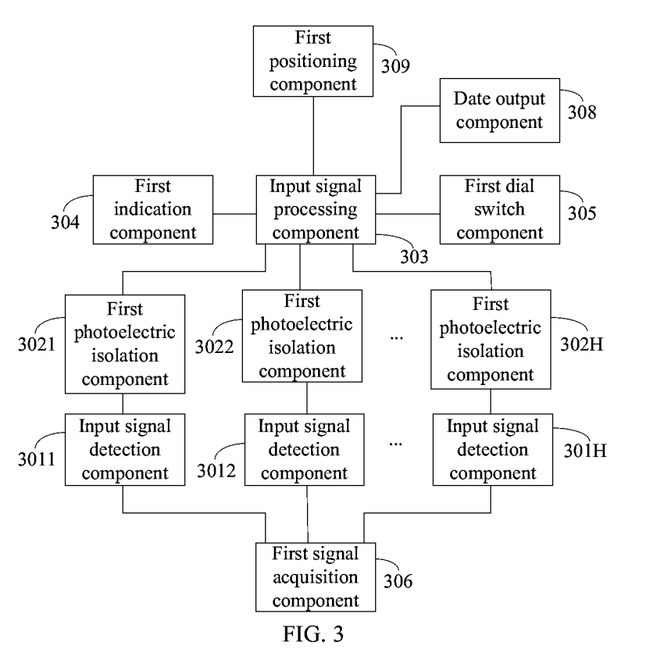
FIG. 3 illustrates a schematic block diagram of a signal input component according to one embodiment of the present disclosure.

As an alternative embodiment, FIG. 3 depicts a schematic block diagram of a signal input component according to one embodiment, referring to FIG. 3, each of the signal input components includes at least one input signal detection component (represented by 3011, . . . , 301H in FIG. 3, where H is an integer greater than 0), at least one first photoelectronic isolated component (represented by 3021, . . . , 302H in FIG. 3) and an input signal processing component, where each input signal detection component is configured to receive one path of first communication signal, where each input signal detection component has a signal transmission function, when the first communication signal is received by the input signal detection component, the input signal detection component can transmit the first communication signal in compatibility to ensure high efficiency of transmission of the communication data, and improve the integrity of data interaction of the signal input component.

The one or plurality of first photoelectric isolated components are connected with the one or plurality of input signal detection components in one-to-one correspondence manner, and each of the first photoelectric isolated components is configured to transmit one path of first communication signal in a photoelectric isolated manner.

Where each of the first photoelectric isolated components can realize photoelectric isolated transmission function of signals, thereby ensures the safety and stability of the signal input components in the transmission process of the first communication signal, and the first communication signal after the photoelectric isolated transmission can keep higher physical security for electronic components.

The input signal processing component 303 is connected with the power switch component 104, the control component 102 and at least one first photoelectric isolated component, and is configured to process the at least one path of first communication signal after the photoelectric isolated transmission to obtain one path of second communication signal.

The power switch component 104 supplies power to the input signal processing component 303 in photoelectric isolated manner, thereby ensures working safety and stability of power supply of the input signal processing component 303; the input signal processing component 303 has signal conversion function and can recognize and process at least one path of first communication signal to obtain one path of second communication signal, the second communication signal includes complete communication data, and the input signal processing component 303 outputs the second communication signal to the control component 102;

therefore, the input signal processing component 303 can process any number of first communication signals high efficiently, so that flexibility and controllability of circuit control of the combined logic control circuit 10 is ensured.

As an alternative embodiment, referring to FIG. 3, each of the signal input components further includes a first indication component 304, the first indication component 304 is connected with the input signal processing component 303, and the first indication component 304 is configured to display a state of the input signal processing component 303.

For example, if the first indication component 304 is a photoelectric alarming device, the first indication component 304 can emit a photoelectric indication signal, so that the user can display different states of the input signal processing component 303 in real time through the first indication component 304; for example, when the input signal processing component 303 outputs the second communication signal, the first indication component 304 sends out a photoelectric indication signal; when the input signal processing component 303 does not sent out the second communication signal, the first indication component 304 does not emit the photoelectric indication signal.

As an alternative embodiment, referring to FIG. 3, the signal input component further includes: a first dial switch component 305 which is connected with the input signal processing component 303 and is configured to generate a first dial code signal according to configuration information of the user.

The input signal processing component 303 is configured to process the at least one path of first communication signal transmitted from the plurality of first photoelectric isolated components to obtain one path of second communication signal according to the first dial code signal.

The first dial switch component 305 can receive the configuration information of the user and output the first dial signal in real time to change the signal conversion process of the input signal processing component 303, the first dial switch component 305 has a flexible circuit control function, the combined logic control circuit 10 performs signal conversion according to the requirement of the user on circuit control, thereby bringing great convenience of circuit control to the user.

As an alternative embodiment, referring to FIG. 3, each of the signal input components further includes: a first signal acquisition component 306 which is connected with the at least one input signal detection component and the at least one external electrical device, and is configured to collect an operation parameter of the corresponding external electrical device and environment parameters in a preset region, and output at least one path of first communication signal.

The input signal processing component is configured to determine an operating state of a corresponding external electrical device of the plurality of external devices according to the at least one path of first communication signal transmitted in the photoelectric isolated manner, and generate one path of second communication signal.

The operating state of the external electrical device includes: normal, short-circuit, disconnected, virtual short, virtual open, overload, and unloaded.

The operating parameters of each external electrical device include: voltage, current, power, and accumulated electric quantity.

The environmental parameters in each preset region include temperature, humidity and atmosphere pressure.

Where the first signal acquisition component can collect voltage change condition, current change condition of each external electrical device, and parameter change condition of the external environment, thereby generates a first communication signal, the first communication signal includes an actual operating state of each external electrical device and a parameter change condition of the external environment; the input signal processing component 303 performs signal feedback control according to the actual operating state of the external electrical device and the parameter change condition of the external environment parameter, thereby ensuring safety of electrical control of the plurality of external electrical devices, the combined logic control circuit 10 can be applied to various different industrial environments.

As an alternative embodiment, referring to FIG. 3, the signal input component further includes a data output component 307, the data output component 307 is connected with the input signal processing component 303 and the control component 102, and the data output component 307 is configured to output a second communication signal to the control component 102.

For example, the data output component 307 includes at least one from a group consisting of CAN, RS485, and optical coupling; the signal input component has higher communication compatibility, compatibility and interaction of data between the control component 102 and each of the signal input components can be realized, the control component 102 realizes accurate signal conversion according to communication data, thereby improves a signal conversion efficiency inside the combined logic control circuit 10.

As an alternative embodiment, referring to FIG. 3, the signal input component further includes a first positioning component 309, the first positioning component 309 is connected with the input signal processing component 303, and is configured to obtain position information of the input signal processing component 303; where the first positioning component 309 also outputs the position information of the input signal processing component 303 to the external terminal devices, so that the user can acquire the actual position of the signal input component in real time; therefore, the first positioning component 309 in this embodiment has a positioning function, supports remote wireless network transmission, so that precision of control and safety of the signal input component are guaranteed.

Figure 4:
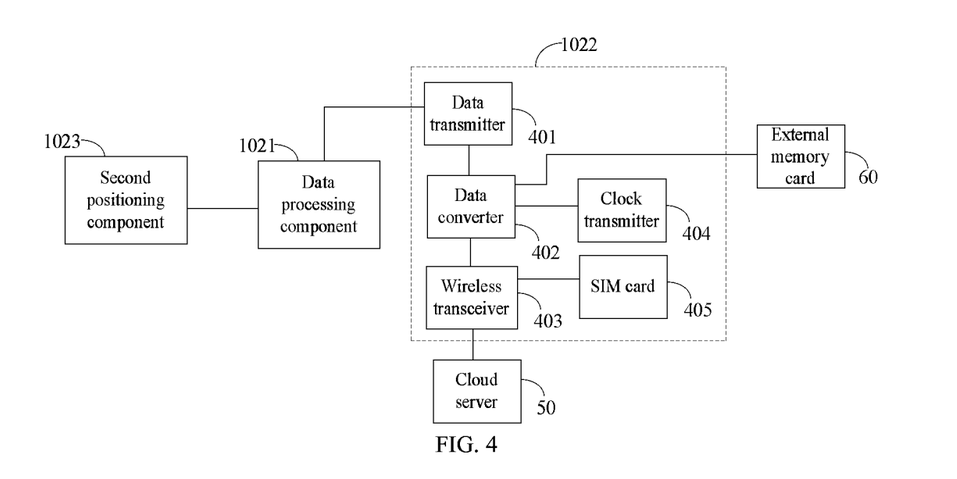
FIG. 4 illustrates a schematic block diagram of a control component according to one embodiment of the present disclosure.

As an alternative embodiment, FIG. 4 depicts a schematic block diagram of a control component 102 according to one embodiment of the present disclosure. Referring to FIG. 4, the control component 102 includes a data processing component 1021 and a gateway component 1022; the data processing component 1021 is connected with the power switch component 104, the at least one signal input component and the at least one signal output component, and the data processing component 1021 is configured to receive at least one path of second communication signal, and generate at least one path of first control signal according to the at least one path of second communication signal.

Where the power switch component 104 can provide power supply to the data processing component 1021 in a photoelectric isolated manner to ensure the safety of power supplying of the data processing component 1021, the data processing component 1021 can implement data logic operation and signal conversion functions, and at least one first control signal output by the data processing component 1021 can realize more flexible control of the external electrical devices, so that the efficiency and the precision of signal processing of the control component 102 are improved.

The gateway component 1022 is connected with the power switch component 104, a cloud server 50 and the plurality of external electrical devices, and the gateway component 1022 is configured to receive working data output by the plurality of external electrical devices, and upload the working data of the plurality of external electrical devices to the cloud server 50.

For example, the working data includes an operating voltage and an operating current of each external electrical device, so that the gateway component 1022 can perform data interaction wirelessly. The gateway component 1022 can collect working data of the external electrical devices in real time, and information interaction between the gateway component 1022 and the cloud server 50 is realized. The cloud server 50 can store the working data of the external electrical devices in real time. The working state of the external electrical devices can be monitored wirelessly through the cloud server 50, so that the user is facilitated to implement the corresponding circuit control function.

As an alternative embodiment, referring to FIG. 4, the gateway component 1022 is further connected with the data processing component 1021, and the gateway component 1022 can receive control data output by the data processing component 1021, and upload the control data output by the data processing component 1021 to the cloud server 50, where the control data output by the data processing component 1021 includes signal conversion state information of the data processing component 1021; when the data processing component 1021 converts at least one path of second communication signal, the control data as output by the data processing component 1021 includes corresponding signal conversion state information; therefore, the control component 102 in this embodiment performs flexible data interaction with the cloud server 50, thereby improving communication compatibility and safety of control of the control component 102.

As an alternative embodiment, referring to FIG. 4, the gateway component 1022 includes a data transmitter 401, a data converter 402, a wireless transceiver 403, and a clock transmitter 404. Where the data transmitter 401 is connected with the at least one external electrical device and is configured to receive the working data output by at least one external electrical device.

For example, the data transmitter 401 can obtain the working state information of the plurality of external electrical devices, and recognize a security state or a fault state of the plurality of external electrical devices according to the working data, the wireless transceiver 403 can implement efficient and accurate transmission of the working data.

The data converter 402 is connected with the data transmitter 401 and the power switch component 104, and is configured to process the working data output by the at least one external electrical device so as to obtain a state recognition signal.

Power supply can be provided to the data converter 402 in isolated manner through the power switch component 104, thereby ensures stability of working of the data converter 402, the data converter 402 can recognize the state information in the working data, the actual operation state of each of the external electrical devices can be comprehensively acquired through the state recognition signal output by the data converter 402, the safety and reliability of data transmission of the gateway component 1022 are improved.

The wireless transceiver 403 is connected with the data converter 402 and the cloud server 50, and is configured to output a state recognition signal to the cloud server 59.

For example, the wireless transceiver 403 includes at least one from a group consisting of second generation mobile communication technology, third generation mobile communication technology, fourth generation mobile communication technology, fifth generation mobile communication technology, narrow band Internet of Things, long range radio, Zigbee, wireless fidelity, and Bluetooth, so that the gateway component 1022 can realize wireless transmission of internal data, thereby facilitates monitoring the states of the external electrical devices in real-time.

The clock transmitter 404 is connected with the data converter 402 and is configured to output a clock signal to the data converter 402.

Clock information can be provided to the data converter 402 through the clock signal, so that the data converter 402 can be kept in a stable operation state and a good signal conversion state, the stability and the reliability of data communication of the gateway component 1022 are improved, the cloud server 50 can receive the state information of the external electrical devices comprehensively.

In one embodiment, the data transmitter 401 is further connected with the data processing component 1021, and the data transmitter 401 also receives control data output by the data processing component 1021, and uploads the control data as output by the data processing component 1021 to the cloud server 50 through the data converter 402 and the wireless transceiver 403 in sequence, the signal conversion state of the data processing component 1021 can be accurately obtained through the cloud server 50.

As an alternative embodiment, referring to FIG. 4, the gateway component 1022 further includes a SIM (Subscriber Identity Module) card 405, the SIM card 405 is configured to store a state recognition signal, and the transmission security and high efficiency of the state recognition signal can be ensured through the SIM card 405.

As an alternative embodiment, the data converter 402 is connected with the external memory card 60, and the data converter 402 can output the state recognition signal to the external memory card 60, so that the external memory card 60 can store the state recognition signal in real time; for example, the external memory card 60 is a TF (Trans Flash Memory) card or an SD (Secure Digital Memory) card.

As an alternative embodiment, referring to FIG. 4, the control component 102 further includes a second positioning component 1023, the second positioning component 1023 is connected with the data processing component 1021, and the second positioning component 1023 is configured to obtain location information of the data processing component 1021; In one embodiment, the second positioning component 1023 is further configured to output the position information of the data processing component 1021 to the external terminal devices so as to facilitate the user to monitor the actual position of the control component 102 in real time, so that the determination of position is facilitated, geographic information management is performed, and maintenance and debugging of the signal conversion process of the control component 102 is facilitated, and the physical security of the control component 102 is ensured; thus, the control component 102 in this embodiment has a positioning function, when the combined logic control circuit 10 is applied to each of the different external environments, the control component 102 can perform centralized conversion on the signal, so that the combined logic control circuit has a high practical value.

Figure 5:
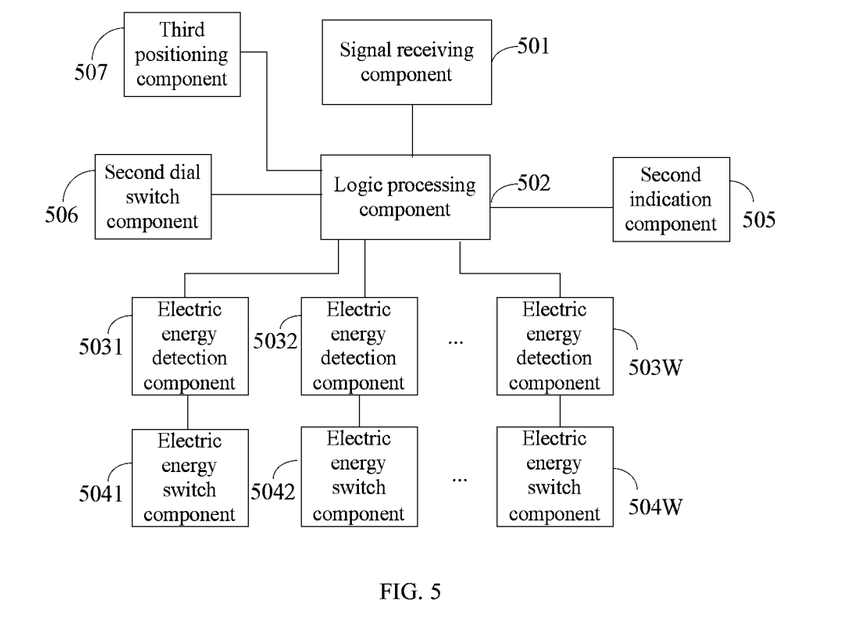
FIG. 5 illustrates a schematic block diagram of a signal output component according to one embodiment of the present disclosure.

As an alternative embodiment, FIG. 5 depicts a schematic block diagram of a signal output component according to one embodiment, referring to FIG. 5, the signal output component includes: a signal receiving component 501, a logic processing component 502, at least one electric energy detection component (represented by 5031, . . . , 503W in FIG. 5, where W is an integer greater than 0) and at least one power switching component (represented by 5041, ..., 504W in FIG. 5); where the signal receiving component 501 is connected with the control component 102, and each signal receiving component is configured to receive one path of first control signal.

In one embodiment, the signal receiving component 501 includes at least one from a group consisting of an RS 232, a CAN bus, and an RS 485, compatible communication is performed between the signal receiving component 501 and the control component 102 to ensure the safety and efficiency of transmission of the first control signal, the signal output component can be driven to achieve a complete circuit function according to the first control signal, so that the sensitivity and the accuracy of circuit control of the combined logic control circuit 10 are improved.

The logic processing component 502 is connected with the signal receiving component 501 and the power switch component 104, and is configured to process one path of first control signal to obtain at least one path of second control signal.

The power switch component can provide power supply to the logic processing component 502 in a photoelectric isolated manner; where the logic processing component 502 has a signal conversion function, and can be compatible to and recognize circuit control information in the first control signal, and perform format conversion on the first control signal to obtain the second control signal. The logic processing component 502 has an efficient and stable signal conversion function for the first control signal, and thereby improves the flexibility and accuracy of electrical control of the external electrical devices, the signal output component have a higher compatibility to signal conversion.

Each of the electric energy detection components is connected with the logic processing component and the power switch component 104, the at least one electric energy detection component is connected with the at least one external electrical device in one-to-one correspondence manner, and each electric energy detection component is configured to detect a power parameter of the corresponding external electrical device so as to obtain one path of power detection signal, and transmit one path of second control signal.

In one embodiment, the power parameter of each external electrical device includes a voltage, a current, a power and an accumulated electric quantity, so that the voltage state and the current state of the corresponding external electrical device can be monitored in real time through the electric energy detection component, and electric energy fluctuation condition of the external electrical device can be acquired in real time through the power detection signal, and the feedback adjustment is performed on the circuit control state of the signal output component according to the power detection signal.

The at least one electric energy switch component is connected with the at least one electric energy detection component in one-to-one correspondence manner, and the at least one electric energy switch component is connected with the at least one external electrical device in one-to-one correspondence manner, and each electric energy switch component is configured to control the corresponding external electrical device to perform circuit operation according to one path of the power detection signal and one path of the second control signal.

The electric energy detection component outputs the power detection signal and the second control signal to the electric energy switch component, the electric energy switch component can change the actual circuit function of the corresponding external electrical device, and the flexibility and high efficiency of circuit control of the external electrical devices are guaranteed. For example, the electric energy switch component includes a relay switch, and the operation states of the external electrical devices can be changed in real time through the relay switch. Each external electrical device can perform the corresponding circuit operation according to the actual requirement of the user on circuit function, and the precision of control response is high.

For example, each electric energy detection component may collect parameters such as voltage, current, power and accumulated electric quantity of each external electrical device so as to monitor, analyze and predetermine the operating conditions of the external electrical device, the operation condition includes: short circuit, disconnected, virtual short, virtual open, overload, and unloaded; the electric energy switch component can perform a comprehensive electrical control on the external electrical devices according to the current operating conditions or predetermined operation conditions of the external electrical devices in combination with the second control signal, thereby realizing protection of operation of each of the external electrical devices, reducing a failure rate of each of the external electrical devices, and prolonging a service life of each of the external electrical devices.

As an alternative embodiment, referring to FIG. 5, the signal output component further includes a second indication component 505, the second indication component 505 is connected with the logic processing component 502, and is configured to display a state of the logic processing component 502; for example, the second indication component 505 can emit a photoelectric display signal, and various states of the logic processing component 502 can be intuitively displayed through the photoelectric display signal; for example, when the logic processing component 502 receives the first control signal and performs signal conversion on the first control signal to obtain at least one path of second control signal, the second indication component 505 sends out a photoelectric display signal, at this time, the signal output component implements normal circuit control on the external electrical devices; in contrary, when the logic processing component 502 does not receive the first control signal, the second indication component 505 does not send out the photoelectric display signal, at this time, the signal output component fails to implement the circuit control function; therefore, in this embodiment, the second indication component 505 can display the circuit control state of the signal output component in real time, the signal output component has a higher flexibility in control.

As an alternative embodiment, referring to FIG. 5, the combined logic control circuit 10 further includes a second dial switch component 506, a second dial switch component 506 and a logic processing component 502, where the second dial switch component 506 is configured to generate a second dial code signal according to the key information of the user.

The logic processing component 502 is configured to process the first control signal to obtain at least one path of second control signal according to the second dial code signal.

In this embodiment, the signal conversion state of the logic processing component 502 can be controlled in real time through the second dial switch component 506, at least one group of first control signal is output through the logic processing component 502, and a flexible circuit control is implemented on any number of external electrical devices; and the signal conversion state of the logic processing component 502 can be changed in real time through the second dial switch component 506, so that the circuit control process of the user is facilitated.

As an alternative embodiment, referring to FIG. 5, the signal output component further includes a third positioning component 507, where the third positioning component 507 is connected with the logic processing component 502, and is configured to obtain position information of the logic processing component 502, so that an accurate monitoring of the geographic position of the signal output components is realized, and the safety and compatibility of circuit control of the signal output component are ensured.

It should be noted that, both the first positioning component 309, the second positioning component 1023 and the third positioning component 507 in the various embodiments described above can be realized by using a GPS (Global Positioning System) chip, for example, the model of the GPS chip is UBLOX 7020, UBLOX8030, HD8040 or EC20.

Figure 6:
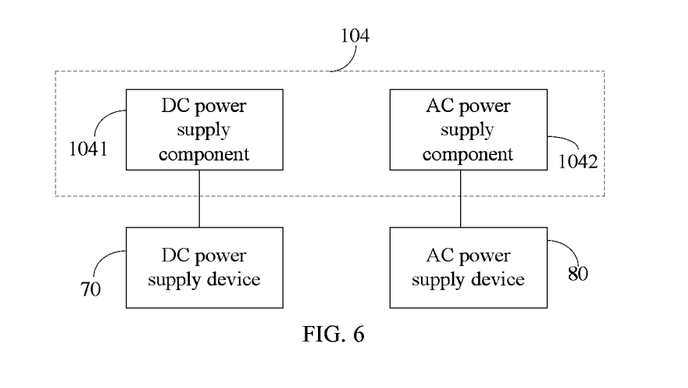
FIG. 6 illustrates a schematic block diagram of a power switch component according to one embodiment of the present disclosure.

As an alternative embodiment, FIG. 6 depicts a schematic block diagram of a power switch component 104 according to one embodiment of the present disclosure, referring to FIG. 6, the power switch component 104 includes: a DC power supply component 1041 and an AC power supply component 1042, where the DC power supply component 1041 is connected with the at least one signal input component, the control component 102 and the at least one signal output component, and is configured to receive a DC power signal output by a DC power supply device 70 when being connected with the DC power supply device 70, and modulate the amplitude of the DC power signal, and output the DC power signal in a photoelectric isolated manner.

The DC power supply device 70 stores DC power; for example, after the DC power supply component 1041 performs a voltage modulation processing on the DC power signal, the DC power signal can meet the rated power supply power requirement of the circuit components in the signal input components, the control component 102 and the signal output components, so that safe power supplying functions of the various circuit components in the combined logic control circuit 10 is realized.

The AC power supply component 1042 is connected with the at least one signal input component, the control component 102, and the at least one signal output component, and is configured to receive the AC power signal output by the AC power device 80 when it is connected with the AC power supply device 80, perform rectification on the AC power signal, and output the AC power signal in a photoelectric isolated manner.

For example, the AC power supply component 1042 can achieve stable power supply for the circuit components by using a primary side and a secondary side of a transformer to perform conversion in isolated manner.

Where the AC power device 80 stores AC electric energy, and after the AC power signal is rectified by the AC power supply component 1042, DC electric energy with a specific amplitude can be obtained, the DC power supply is output to the various circuit components in the combined logic control circuit 10 in a photoelectric isolated manner, so that the stability of power supply and the efficiency of circuit control of the combined logic control circuit 10 are guaranteed.

Therefore, in this embodiment, the power supply device includes the DC power supply device 70 and the AC power supply device 80 which can provide DC power supply and AC power supply to the circuit components in the combined logic control circuit 10; for example, the DC power signal is a DC signal having a voltage ranging from 9V to 30V, and the AC power signal is an alternating current signal having a voltage ranging from 90 V to 250 V.

Figure 7:
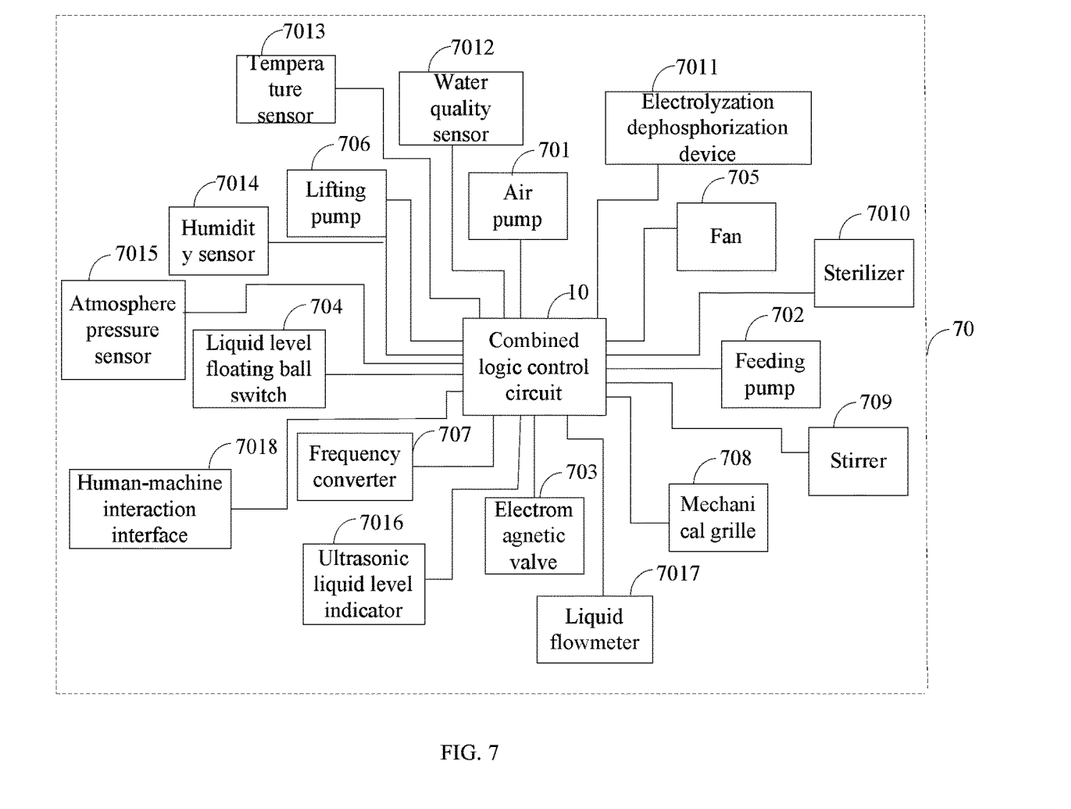
FIG. 7 illustrates a schematic block diagram of a sewage treatment system according to one embodiment of the present disclosure.

FIG. 7 depicts a schematic block diagram of a sewage treatment system 70 according to one embodiment of the present disclosure, the sewage treatment system 70 includes: the aforesaid combined logic control circuit 10, an air pump 701, a feeding pump 702, an electromagnetic valve 703, a fan 705, a lifting pump 706, a frequency converter 707, a mechanical grille 708, a stirrer 709, a sterilizer 7010, an electrolyzation dephosphorization device 7011, a water quality sensor 7012, a temperature sensor 7013, a humidity sensor 7014, an atmosphere pressure sensor 7015, an ultrasonic liquid level indicator 7016, a liquid flowmeter 7017, a human-machine interaction interface 7018, and a liquid level floating ball switch 704; wherein the air pump 701, the feeding pump 702, the electromagnetic valve 703, the fan 705, the lifting pump 706, the frequency converter 707, the mechanical grille 708, the stirrer 709, the sterilizer 7010, the electrolyzation dephosphorization device 7011, the water quality sensor 7012, the temperature sensor 7013, the humidity sensor 7014, the atmosphere pressure sensor 7015, the ultrasonic liquid level indicator 7016, the liquid flowmeter 7017, the human-machine interaction interface 7018, and the liquid level floating ball switch 704 are commonly connected with the combined logic control circuit 10. Referring to the embodiments that correspond to FIGS. 1-6, after centralized circuit control is performed by the combined logic control circuit 10, such that various electrical devices in the sewage treatment system 70 can implement corresponding circuit functions, the control precision and efficiency of the sewage treatment system 70 in the sewage treatment process are improved, the requirement of the user on sewage treatment is met, so that the sewage treatment system 70 has high practical value.

What is claimed is:
1. A combined logic control circuit, comprising:
a plurality of signal input components, wherein each of the plurality of signal input components is configured to receive at least one path of first communication signal, transmit the at least one path of first communication signal in a photoelectric isolated manner, and process the at least one path of first communication signal to obtain at least one path of second communication signal;
a control component which is connected with the plurality of signal input components and is configured to receive the at least one path of second communication signal, and generate at least one path of first control signal according to the at least one path of second communication signal;
a plurality of signal output components, wherein each of the plurality of signal output components is commonly connected with the control component and a plurality of external electrical devices, and is configured to process the at least one path of first control signal to obtain at least one path of second control signal, and control the plurality of external electrical devices to perform a circuit operation according to the at least one path of second control signal; and
a power switch component which is commonly connected with the plurality of signal input components, the control component and the plurality of signal output components, and is configured to be connected with a power device to receive a power signal output by the power device, convert the power signal output in an isolated manner and output the power signal output converted in the isolated manner.

2. The combined logic control circuit according to claim 1, further comprising:
a first communication component which is commonly connected with the plurality of signal input components and the control component, and is configured to output the second communication signal to the control component; and
a second communication component which is connected with the control component and the plurality of signal output components, and is configured to output the first control signal to the plurality of signal output components.

3. The combined logic control circuit according to claim 2, wherein the first communication component comprises at least one from a group consisting of a CAN bus, an RS485, an RS 232, and an Ethernet.

4. The combined logic control circuit according to claim 2, wherein the second communication component comprises at least one from a group consisting of a CAN bus, an RS485, an RS 232, and an Ethernet.

5. The combined logic control circuit according to claim 1, wherein each of the plurality of signal input components comprises:
a plurality of input signal detection component, wherein each of the plurality of input signal detection components is configured to receive the at least one path of first communication signal;
a plurality of first photoelectric isolated components, wherein the plurality of first photoelectric isolated components are connected with the plurality of input signal detection components in a one-to-one correspondence manner, and each of the plurality of first photoelectric isolated components is configured to transmit the at least one path of first communication signal in a photoelectric isolated manner; and
an input signal processing component which is commonly connected with the power switch component, the control component and the plurality of first photoelectric isolated components, and is configured to process the at least one path of first communication signal transmitted from the plurality of first photoelectric isolated components to obtain the at least one path of second communication signal.

6. The combined logic control circuit according to claim 5, wherein each of the plurality of signal input components further comprises:
a first indication component which is connected with the input signal processing component and is configured to display a state of the input signal processing component.

7. The combined logic control circuit according to claim 5, wherein each of the plurality of signal input components further comprises:
a first dial switch component which is connected with the input signal processing component and is configured to generate a first dial code signal according to configuration information of a user;
the input signal processing component is configured to process the at least one path of first communication signal transmitted through photoelectric isolated manner according to the first dial code signal to obtain the at least one path of second communication signal.

8. The combined logic control circuit according to claim 5, wherein each of the plurality of signal input components further comprises:

a first signal acquisition component which is connected with the plurality of input detection components and the plurality of external electrical devices, and is configured to collect operation parameters of the plurality of external electrical devices and an environment parameter in a preset region corresponding to the first signal acquisition component, and output the at least one path of first communication signal;
the input signal processing component is configured to determine an operating state of an external electrical device of the plurality of external devices that corresponds to the input signal processing component according to the at least one path of first communication signal transmitted from the plurality of first photoelectric isolated components, and generate the first communication signal.

9. The combined logic control circuit according to claim 8, wherein the operating state of the external electrical device comprises: normal, short-circuit, disconnection, virtual short, virtual open, overload, and unloaded.

10. The combined logic control circuit according to claim 8, wherein the operating parameters of the plurality of external electrical device comprise: a voltage current, a power, and an accumulated electric quantity;
the environmental parameter in the preset region comprises: a temperature, a humidity, and atmospheric pressure.

11. The combined logic control circuit according to claim 1, further comprising:
a wireless communication component which is connected with the control component and a mobile terminal, and is configured to transmit a wireless communication signal sent by the mobile terminal to the control component in a wireless transmission manner;
the control component is configured to receive the at least one path of second communication signal, and convert the at least one path of second communication signal according to the wireless communication signal to generate at least one path of the first control signal.

12. The combined logic control circuit according to claim 11, wherein the wireless communication component comprises at least one from a group consisting of second generation mobile communication technology, third generation mobile communication technology, fourth generation mobile communication technology, fifth generation mobile communication technology, narrow band Internet of Things, long range radio, Zigbee, wireless fidelity, and Bluetooth.

13. The combined logic control circuit according to claim 1, further comprising:
a touch screen component which is configured to receive a key information from a user, and output a touch screen control signal; and
an Ethernet communication component which is connected between the touch screen component and the control component, and is configured to output the touch screen control signal to the control component in an Ethernet communication mode;
the control component is configured to receive the at least one path of second communication signal, and convert the at least one path of second communication signal according to the touch screen control signal to generate at least one path of the first control signal.

14. The combined logic control circuit according to claim 1, further comprising:
a signal storage component which is connected with the control component and is configured to store the at least one path of second communication signal.

15. The combined logic control circuit according to claim 1, further comprising:
- a plurality of sensor components, wherein the plurality of sensor components are connected with the control component and the plurality of external electrical devices, and are configured to collect operating parameters of the plurality of external electrical devices and an environmental parameter in a preset region, and output a first regulation signal;
- the control component is configured to receive the at least one path of second communication signal, and convert the at least one path of second communication signal according to at least one path of the first regulation signal to generate at least one path of the first control signal.

16. The combined logic control circuit according to claim 1, wherein the control component comprises:
- a data processing component which is connected with the power switch component, the plurality of signal input components and the plurality of signal output components, and is configured to receive the at least one path of second communication signal, and generate at least one path of the first control signal according to the at least one path of second communication signal; and
- a gateway component which is connected with the power switch component, a cloud server, and at least one of the plurality of external electrical devices, and is configured to receive operation data output by at least one of the plurality of external electrical devices, and upload the operation data output of the at least one of the plurality of external electrical devices to the cloud server.

17. The combined logic control circuit according to claim 16, wherein the gateway component comprises:
- a data transmitter which is connected with at least one of the plurality of external electrical devices and is configured to receive operation data output by the at least one of the plurality of external electrical devices;
- a data converter which is connected with the data transmitter and the power switch component, and is configured to process the operation data output by the at least one of the plurality of external electrical devices to obtain a state recognition signal;
- a wireless transceiver which is connected with the data converter and the cloud server and is configured to output the state recognition signal to the cloud server; and
- a clock transmitter which is connected with the data converter and is configured to output a clock signal to the data converter.

18. The combined logic control circuit according to claim 1, wherein each of the signal output components comprises:
- a plurality of signal receiving components connected with the control component, wherein each of the plurality of signal receiving components is configured to receive one path of the first control signal;
- a logic processing component which is connected with the signal receiving components and the power switch component, and is configured to process one path of the first control signal to obtain at least one path of the second control signal; and
- a plurality of electric energy detection components, wherein each of the plurality of electric energy detection components is connected with the logic processing component and the power switch component, and the plurality of electric energy detection components are connected with the plurality of external electrical devices in a one-to-one correspondence manner, and each of the plurality of electric energy detection components is configured to detect a power parameter of a corresponding external electrical device to obtain a power detection signal, and transmit one path of the second control signal; and
- a plurality of power switch components, wherein the plurality of power switch components are connected with the plurality of electric energy detection components in a one-to-one correspondence manner, and the plurality of power switch components are connected with the plurality of external electrical devices in a one-to-one correspondence manner, and each of the plurality of power switch components is configured to control the corresponding external electrical device to perform circuit operation according to one path of the power detection signal and one path of the second control signal.

19. The combined logic control circuit according to claim 1, wherein the power switch component comprises:
- a DC power supply component which is connected with the plurality of signal input components, the control component, and the plurality of signal output components, and is configured to receive, when being connected with a DC power device, a DC power signal output by the DC power device, and regulate an amplitude of the DC power signal output by the DC power device, and isolate and output the DC power signal output by the DC power device; and
- an AC power supply component which is connected with the plurality of signal input components, the control component, and the plurality of signal output components, and is configured to receive, when being connected with a AC power device, an AC power signal output by the AC power device, and perform rectification on the AC power signal output by the AC power device, and isolate and output the AC power signal output by the AC power device.

20. A sewage treatment system, comprising:
the combined logic control circuit according to claim 1, an air pump, a feeding pump, an electromagnetic valve, a fan, a lifting pump, a frequency converter, a mechanical grille, a stirrer, a sterilizer, an electrolyzation dephosphorization device, a water quality sensor, an ultrasonic liquid level indicator, a liquid flowmeter, a human-machine interaction interface, a temperature sensor, a humidity sensor, an atmosphere pressure sensor, and a liquid level floating ball switch; wherein the air pump, the feeding pump, the electromagnetic valve, the fan, the lifting pump, the frequency converter, the mechanical grille, the stirrer, the sterilizer, the electrolyzation dephosphorization device, the water quality sensor, the ultrasonic liquid level indicator, the liquid flowmeter, the human-machine interaction interface, the temperature sensor, the humidity sensor, the atmosphere pressure sensor, and the liquid level floating ball switch are commonly connected with the combined logic control circuit.

* * * * *

UNITED STATES PATENT AND TRADEMARK OFFICE
CERTIFICATE OF CORRECTION

PATENT NO. : 11,955,968 B2  
APPLICATION NO. : 17/668168  
DATED : April 9, 2024  
INVENTOR(S) : Wensheng Li et al.

Page 1 of 1

It is certified that error appears in the above-identified patent and that said Letters Patent is hereby corrected as shown below:

On the Title Page

Item (73), Please change "Unnan Province (CN)" to "Yunnan Province (CN)".

Signed and Sealed this  
Thirteenth Day of May, 2025

Coke Morgan Stewart  
*Acting Director of the United States Patent and Trademark Office*